Figure 1:
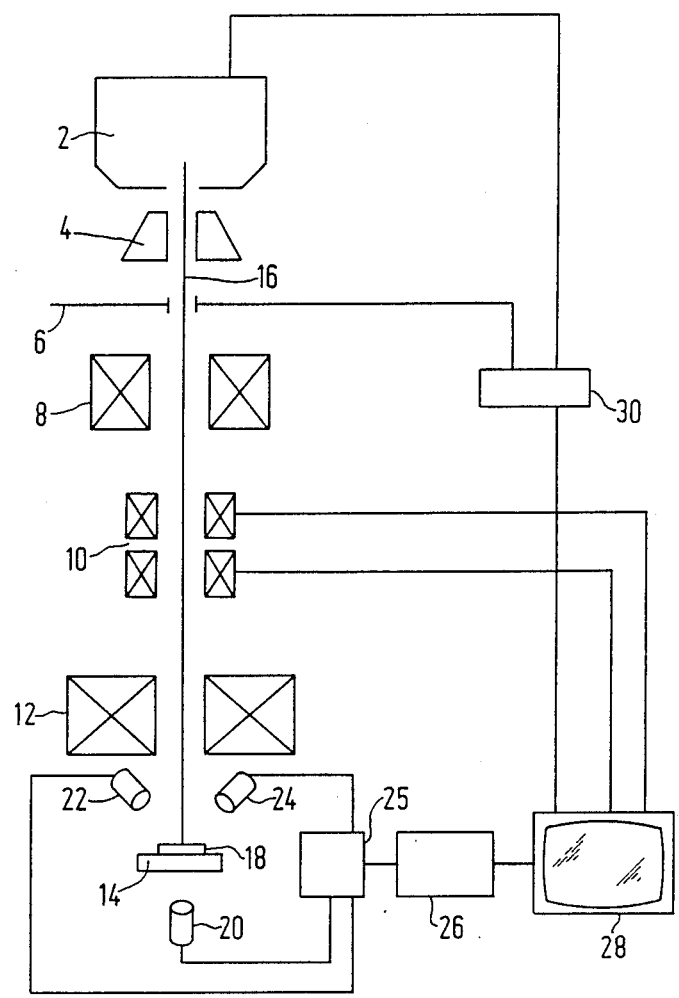

United States Patent [19]

Van Gorkom et al.

[11] Patent Number: 4,871,911
[45] Date of Patent: Oct. 3, 1989

[54] ELECTRON BEAM APPARATUS COMPRISING A SEMICONDUCTOR ELECTRON EMITTER

[75] Inventors: Gerardus G. P. Van Gorkom; Arthur M. E. Hoeberechts, both of Eindhoven; Karel D. Van Der Mast, Pijnacker; Harm Tolner, Eindhoven, all of Netherlands

[73] Assignee: U.S. Philips Corporation, New York, N.Y.

[21] Appl. No.: 77,060

[22] Filed: Jul. 17, 1987

Related U.S. Application Data

[63] Continuation of Ser. No. 743,223, Jun. 10, 1985.

[30] Foreign Application Priority Data

Feb. 14, 1985 [NL] Netherlands ............... 8500413

[51] Int. Cl.$^4$ .................................................. G21K 7/00
[52] U.S. Cl. ........................... 250/310; 250/306; 313/346 R; 313/366
[58] Field of Search ............... 250/310, 311, 213 VT, 250/306; 313/346 R, 366, 446

[56] References Cited

U.S. PATENT DOCUMENTS

| | | | |
|---|---|---|---|
| 3,334,248 | 8/1967 | Stratton | 313/346 R |
| 3,631,303 | 12/1971 | Antypas | 313/346 R |
| 3,931,519 | 1/1976 | Coates et al. | 250/310 |
| 4,325,084 | 4/1982 | Van Gorkom | 313/446 |
| 4,370,797 | 2/1983 | Van Gorkom | 313/366 |

FOREIGN PATENT DOCUMENTS

1303660  1/1973  United Kingdom.

Primary Examiner—Craig E. Church
Attorney, Agent, or Firm—Paul R. Miller

[57] ABSTRACT

An electron beam apparatus comprising a semiconductor electron emitter whose emissive surface dimensions are determined by dimensions of a p-n junction provided in the semiconductor element. By optimizing the dimensions of the emissive surface in relation to the electron-optical properties of the apparatus, an emitter is realized which combines optimum beam formation or imaging with a sufficiently large beam current and a high beam current density as required by the apparatus.

16 Claims, 2 Drawing Sheets

ELECTRON BEAM APPARATUS COMPRISING A SEMICONDUCTOR ELECTRON EMITTER

This is a continuation of application Ser. No. 743,223, filed June 10, 1985, and all benefits for such earlier application are respectfully requested for this continuation application.

The invention relates to an electron beam apparatus comprising, arranged inside an evacuatable housing, an electron source which comprises an electron emitter for generating an electron beam having a comparatively high emission current density and an electron-optical lens system.

In an electron beam apparatus such as, for example, electron microscopes, electron beam writers and similar apparatus, it is often desirable to have an electron source available which source is capable of supplying an electron beam having a high current density, sufficient stability and attractive properties in relation to the electron-optical system of the apparatus.

Electron beam apparatus comprising a conventional thermal cathode or a cathode made of $LaB_6$, such as described in U.S. Pat. No. 3,631,290, supply an electron beam whose brightness is insufficient for many applications. Maximum current densities which can be achieved in this respect are, for example, approximately 5 a/cm² or 30 A/cm², respectively. The emissive surface of such electron source which is of relevance for the electron-optical system is too large in relation to the electron-optical properties of the apparatus, so that optimum beam formation, spot formation or imaging cannot be achieved.

Electron beam apparatus comprising a field emission source as described in U.S. Pat. No. 3,631,291 are capable of supplying electron beams having a comparatively high current density, but such a source has several drawbacks such as instability of emissive power, positioning and geometry of the emitter. Moreover, such sources are not suitable for the supply of the frequently desired large total beam currents. From an electron-optical point of view, the dimension of the cathode and hence in this case of the virtual object of such a source is too small to obtain sufficiently high current densities. This is mainly due to the necessarily limited geometry of the emitter. Moreover the energy spread of the electrons in an electron beam produced by the described sources is comparatively large so that chromatic errors which are inadmissibly large are liable to occur in the electron-optical image.

An electron source as described in U.S. Pat. No. 4,419,561 has succeeded in mitigating some of the drawbacks of the field-emission source, but the dimensions, positioning and the energy spread again render this source less suitable for many applications. The drawbacks of these sources relative to the heating of the emission wire and the positioning thereof have been partly solved by means of an electron source as described in Netherlands Patent Application 8302275, corresponding to U.S. Pat. No 4,591,753. However, the temperature threshold, the comparatively fast evaporation of the cathode wire and the resultant contamination of the apparatus as well as the non-adapted object dimensions and the large energy spread are still drawbacks of this source.

It is the object of the present invention to mitigate these drawbacks; and to achieve this, an electron beam apparatus of the kind set forth is characterized in that the electron emitter comprises a semi-conductor element in which there is provided, parallel to an emissive surface, a p-n junction which is to be connected in the reverse direction and whose dimensions define surface dimensions of the emissive surface to electron optical properties of the apparatus with the current density and the current intensity of an electron beam to be emitted being optimized at the same time.

Because an electron beam apparatus in accordance with the invention uses a cold cathode as the electron emitter, the known thermal problems are avoided in this apparatus. Using this electron emitter, electron beams having a sufficiently high current density and current intensity can be readily achieved and the dimensions of the emissive surface defined by the transverse dimensions of the p-n junction enable optimum beam and spot shaping and electron-optical imaging. The semiconductor electron emitter is constructed so as to operate with a p-n junction which is connected in the reverse direction. Due to the use of a source comprising a p-n junction connected in the reverse direction, so-called hot electrons are emitted. This means that the electrons to be emitted must overcome a potential gradient when they emerge from the emissive surface. Known drawbacks of the use of an electron emitter having a negative electron affinity (NEA) for generating so-called cold electrons are now avoided. An important one of these drawbacks is the high susceptibility of the emissive surface to external disturbances of the emission. For specific properties of a semiconductor element which emits hot electrons and which is connected in the reverse direction, reference is made to an article by Bartelink et al in Physical Review, Vol. 130. No. 3, May 1963, pp 972–985.

In a preferred embodiment of an electron beam apparatus in accordance with the invention, the largest transverse dimension of a consecutive emissive surface is limited to a maximum of, for example approximately 10 $\mu$m. Using semiconductor techniques, such as ion implantation, for example it is comparatively easy to realize a p-n junction having such a dimension. This offers major advantages for an electron beam apparatus because the dimensions of the emissive surface is thus adapted to electron-optical requirements to be imposed relative to the electron-optical lens system of the apparatus. Surprisingly, it has been found that by using dimensions of a customary order of magnitude a very effective emitter can indeed be realized. Even with an amply high current density for a source with these dimensions no problems are encountered relative to discharge of non-emitted electrons, so that no disturbing internal heating occurs in the semiconductor element and no potential distribution is generated which would adversely affect the current density distribution of the emitted electron beam. For some applications, for example, for beam writers, it may be attractive to use an elongated emissive surface, for example having a length/width radio of, for example from 5:1 to 10:1. Thus, a beam having an elongated cross-section can be realized and spaced charge problems can be reduced. Moreover, by using a line-shaped beam-splitting system, a row of 10 separate spots can be formed, for example. For optimizing the images use may be made, if desired, of a non-rotationally symmetrical electron-optical lens. Such an elongated emissive surface is preferably rectangular but may also be, for example, substantially elliptical, to realize a particularly narrow spot (see U.S. Pat. No. 3,881,136). A rectangularly emissive surface may notably form a square which may be attractive, for example, for beam writers because this allows for the formation of an electron beam having a rectangular cross-section and hence a similar shaped writing electron spot. In such an apparatus for the manufacture of integrated circuits, it may be advantageous to use a regular polygon in view of the manufacturing properties. Using known techniques, for example as described in U.S. Pat. No. 4,419,561, it is then also possible to apply beam shaping. In apparatus such as electron microscopes, it will usually be advantageous to use a round emissive surface in view of the customary rotationally-symmetrical electron-optical lens system. In all these cases dimensions of the emissive surface can be optimally adapted to the electron-optical system. In a preferred embodiment transverse dimensions of a singular emissive surface are limited to a maximum of 10 μm, for example and usually preferably to a value of between, for example 0.5 μm and 5 μm.

It is also comparatively simple to realize composite emissive surfaces, such as a central emissive surfaces, which is surrounded by an annular second surface, or an array or a matrix of several surfaces. When a sufficiently large distance is chosen between the sub-regions of a composite emmisive surface, the emission of each of these surfaces can be simply and independently controlled.

The p-n junction in the electron emitter is preferably located at a depth of from approximately 0.01 μm to 0.05 μm below the emissive surface.

Because at the surface no difference occurs in the semiconductor material of the emissive surface and that of the surrounding cathode surface, no edge problems will occur.

The semiconductor element of a preferred embodiment consists of Si; and very good results have been obtained by means of this material also in relation to service life. However, it is alternatively possible to use, for example SiC, Si—$SiO_2$ combinations, GaAs or similar group III-V combinations. Actually, the choice of the material is not relevant for the invention since as long as the requirements relation to a high current density together with emissive surface dimensions which are adapted to the apparatus are satisfied and a sufficiently long service life can be achieved.

In order to achieve a further increase of the emission density, in a further embodiment the semiconductor element is provided at the area of the emissive surface with a substantially monomolecular layer of an appropriate material such as Cs, Ba, AgO, PtO, MiO, $CO_2$, C etc.; good results have been obtained notably with Cs and Ba.

The method of manufacturing a semiconductor electron emitter makes it comparatively simple to construct the emitter as a matrix or an array of emissive elements, for example, a series of 10 elements or an orthogonal matrix of 10×10 elements. Using multi-systems as described in U.S. Pat. No. 3,491,236, U.S. Pat No. 4,524,278 or U.S. Pat. No. 4,568,833, it is comparatively simple to render beams of each of these elements separately controllable because direct cathode control of at least the beam current is now possible, and a large part of the beam splitting system of the apparatus can now be dispensed with. Such a multi-beam apparatus is excellently suitable, for example, for the production of integrated circuits, notably those circuits where the electron beam writes directly in the semiconductor material i.e. without intermediate masks.

Figure 2:
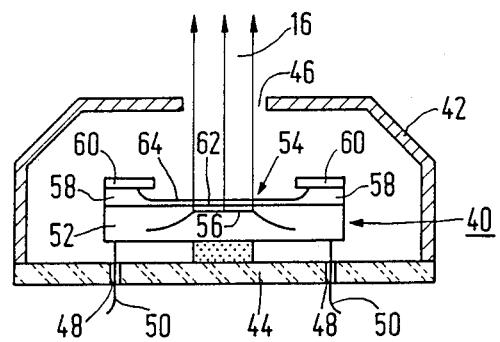
Figure 3:
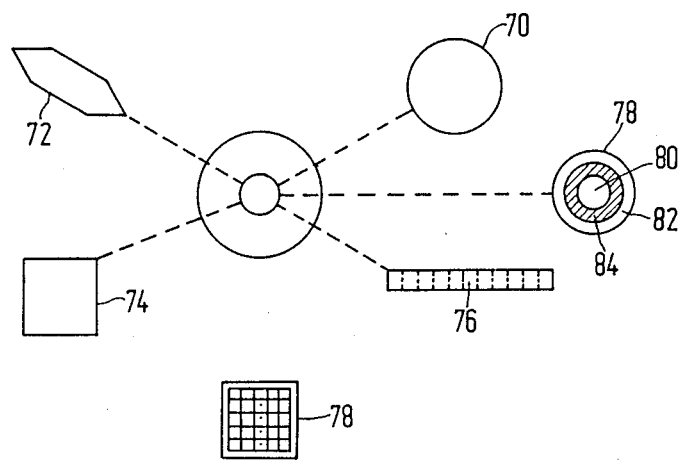

Some preferred embodiments will be described in detail hereinafter which reference to the drawing. Therein:

FIG. 1 diagrammatically shows an electron beam apparatus in accordance with the invention in the form of a scanning electron microscope, FIG. 2 is a more detailed representation of an electron emitted for such an apparatus, and FIG. 3 shows some examples of emissive surfaces of such an electron emitter.

A scanning electron microscope as shown in FIG. 1, comprises an electron source 2, an anode 4, a control electrode 6, a condensor lens system 8, a beam scanning coil system 10, an objective lens system 12, and a specimen table 14. An electron beam 16 generated in the electron source is incident on a specimen 18 arranged on the specimen table. Detectors 20, 22 and 24 are capable of detecting different types of radiation as products of the interaction between the electron beam and the specimen. By a signal selector 25 and a signal processing device 26, the signals are applied to a monitor 28. The monitor in a scanning electron microscope is synchronized by signals from the beam scanning system 10 and is also connected, for example to a control device 30 for beam blanking. Even though the invention is described herein with reference to the scanning electron microscope shown it will be apparent that the invention is by no means restricted thereto; and the invention can also be very well used, for example in electron beam writers, (scanning) transmission electron microscopes and similar apparatus. A column of a scanning electron microscope in adapted form can serve, for example as a column for a beam writer as described, for example, in U.S. Pat No. 3,491,236.

An electron source as shown in FIG. 2 comprises a semiconductor element 40 which is accomdated in a housing 42 with a carrier table 44 and a diaphragm aperture 46 for the passage of the electron beam 16. The base plate or carrier table 44 comprises passages 48 for supply leads 50 of the electron emitter. The semiconductor element 40 contains a crystal semiconductor material 52 which consists, for example of Si, GaAs, SiC etc. At a small distance from a free surface 54 a p-n junction 56 is provide in the crystal, with transverse dimensions of the junction, that is to say the dimensions in its plane, being well defined. As is customary, a part of the crystal is covered with, for example, an oxide layer 58 on which there may be provided a conductive layer 60. The conductor 60 can act as a gate electrode. For a more detailed description of the geometry and the construction of such an element reference is made to U.S. Pat. No. 4,303,930. Because the p-n junction is connected in the reverse direction, electrons will be emitted from and emissive surface 62 which is situated opposite the p-n junction, with the electrons reaching the electron-optical system under the influence of a positive potential which acts through the aperture 46. On the free surface 54 of the semiconductor element there may be provided a preferably approximately monomolecular layer of a material which reduces the electron exit potential, such as for example, Cs or Ba, so that the efficiency of the source can be increased, if necessary. Such a layer can be provided, for example, by depositing the desired material in a space 66 within the housing 42 from the gaseous phase.

FIG. 3 diagrammatically shows some preferred embodiments of emissive surfaces. For the sake of clarity it is to be again noted that the geometry of the emissive surface is in this case determined by the geometry of the p-n junction. All surfaces are chosen so that optimum adaptation to the electron-optical properties of the apparatus is obtained. Depending on the relevant application, a round emissive surface 70 has a diameter of, for example from approximately 0.5 to 5 μm and thus has optimum dimensions as an object for further imaging in the apparatus. Due to this choice of the dimensions, the electrons which escape in the transverse direction, i.e. electrons which are not deliberately emitted, do not cause a disturbing field or distrubing heating of the semiconductor element at this area. A round emissive surface is suitable, for example for imaging apparatus such as an electron microscope. For applications requiring an electron spot which is sharply defined mainly in one direction, use can be made of an emissive surface 72. The advantages of such a geometry are described in U.S. Pat No. 3,881,136; it can be used extremely well, for example, for the formation of images in which a high resolution is desired mainly in one direction. The dimensions may then be, for example $1 \times 5$ μm$^2$. Notably for use in electron beam writers in which an electron spot is required which is sharply defined on two sides there is a square emissive surface 74 with sides of, for example from 0.5 to 5 μm. Such a geometry is also very suitable for beam shaping as well as for splitting the electron spot into geometrically defined parts. As has already been stated, use can also be made of a regular polygon. The emissive surfaces 76 and 78 are composite emissive surfaces. The emissive surface 76 comprises a linear array of, for example 10 emissive sub-surfaces which are identical in this case. An apparatus can then operate with a multiple beam as described in U.S. Pat. Nos. 4,524,278 and 4,568,833, it being possible to control each of the sub-beams individually. The same consideration hold good for the emissive surface 78 in the form of a matrix of emissive sub-surfaces. Composite emissive surfaces are particularly suitable for electron beam writers, notably when such apparatus are used for the direct manufacture of integrated circuits, i.e. without the assistance of masks. A composite emissive surface 78 comprises a central sub-surface 80 and an annular sub-surface 82 as the emissive surfaces and a ring 84 as a non-emissive surface. Such a surface is useful, for example for measurement methods related to dark-field illumination ect. Such a composite surface may alternatively have a rectangular, square or other shape.

The references U.S. Pat. Nos. 4,524,278 and 4,568,833 cited in this specification have been published as EP pat. appln. No. 87196 and EP pat. appln. No. 92873 respectively. The article "An efficient silicon cold cathode for high current densities" is published by two of the inventors in Philips J. Res. 39, October 1984, pp 51–60, describes some properties of the semi-conductor device per se

What is claimed is:

1. An electron beam apparatus comprising
   an evacuatable housing,
   electron source means within said housing for generating an electron beam having a high emission current density, said electron source means including a semiconductor element electron emitter means for optimizing current intensity of said electron beam simultaneously with said current density.
   said semiconductor element electron emitter means having an emissive surface, and said semiconductor element electron emitter means having a reverse connected p-n junction disposed within said semiconductor element electron emitter means and parallel to said emissive surface, said reverse connected p-n junction having dimensions defining surface dimensions of said emissive surface,
   an electron-optical lens system within said housing for directing said electron beam from said semiconductor element electron emitter means,
   a specimen receiving said electron beam from said electron-optical lens system, and
   means for detecting radiation from said specimen and displaying information from said specimen.

2. An electron beam apparatus according to claim 1, wherein said emissive surface has a maximum transverse dimension of approximately 10 μm.

3. An electron beam apparatus according to claim 1 or 2, wherein said emissive surface is substantially circular.

4. An electron beam apparatus according to claim 1 or claim 2, wherein said emissive surface is, a substantially regular polygon.

5. An electron beam apparatus according to claim or 2, wherein said emissive surface has transverse dimensions of approximately 0.5 μm to 10 μm.

6. An electron beam apparatus according to claim 1, or 2, wherein said emissive surface includes a central part and a surrounding annular part.

7. An electron beam according to claim 1, or 2, wherein said semiconductor element electron emitter means is Si, and wherein said p-n junction is situated at most approximately 0.05 μm below said emissive surface.

8. An electron beam apparatus according to claim 1, or 2, wherein said semiconductor element electron emitter means is SiC.

9. An electron beam apparatus according to claim 1, or 2, wherein said semiconductor element electron emitter means consists of GaAs.

10. An electron beam apparatus according to claim 1, or 2, wherein said semiconductor element electron emitter means is a metal-to-metal oxide interface.

11. An electron beam apparatus according to claim 1, or 2, wherein said emissive surface is covered with a substantially monomolecular layer, said layer reducing an exist potential.

12. An electron beam apparatus according to claim 1, or 2, wherein said emissive surface emits an electron beam having a current density of at least 1000 A/cm$^2$ at said emissive surface.

13. An electron beam apparatus according to claim 1, or 2, wherein said electron source means includes a gate electrode.

14. An electron beam apparatus according to claim 13, wherein said gate electrode is divided into several sub-electrodes, said sub-electrodes being electrically insulated from one another, and said sub-electrodes being independently controlled.

15. An electron beam apparatus according to claim 5, wherein said transverse dimensions range from 0.5 μm to 5 μm.

16. An electron beam apparatus according to claim 1 or 2, wherein said p-n junction is situated in a plane parallel to said emissive surface, said plane being approximately 0.01 μm to 0.05 μm below said emissive surface.

* * * * *